United States Patent
Sample et al.

(10) Patent No.: US 6,285,211 B1
(45) Date of Patent: *Sep. 4, 2001

(54) I/O BUFFER CIRCUIT WITH PIN MULTIPLEXING

(75) Inventors: Stephen P. Sample, Saratoga, CA (US); Michael R. Butts, Portland, OR (US); Kevin A. Norman, Belmont; Rakesh H. Patel, Cupertino, both of CA (US)

(73) Assignees: Altera Corporation, San Jose; Quickturn Design Systems, Inc., Mountain View, both of CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/460,535

(22) Filed: Dec. 13, 1999

Related U.S. Application Data

(63) Continuation of application No. 08/895,470, filed on Jul. 16, 1997, now Pat. No. 6,020,760.

(51) Int. Cl.[7] .......................... H01L 25/00; H03K 19/177
(52) U.S. Cl. ................................. 326/41; 326/39; 326/40
(58) Field of Search .................................. 326/37, 38, 39, 326/40, 41, 93

(56) References Cited

U.S. PATENT DOCUMENTS

| | | |
|---|---|---|
| Re. 34,444 | 11/1993 | Kaplinsky . |
| 4,293,783 | 10/1981 | Patil . |
| 4,825,414 | 4/1989 | Kawata . |
| 4,855,958 | 8/1989 | Ikeda . |
| 4,893,280 | 1/1990 | Gelsomini et al. . |
| 4,963,770 | 10/1990 | Keida . |
| 4,975,601 | 12/1990 | Steele . |
| 5,042,004 | 8/1991 | Agrawal et al. . |

(List continued on next page.)

FOREIGN PATENT DOCUMENTS

| | | |
|---|---|---|
| 0081917 | 8/1983 | (EP) . |
| 0410759 A2 | 1/1991 | (EP) . |
| 0415542 A2 | 3/1991 | (EP) . |
| 0420389 A1 | 4/1991 | (EP) . |
| 0507507 A2 | 10/1992 | (EP) . |
| 0530985 A2 | 3/1993 | (EP) . |
| 0569137 A2 | 11/1993 | (EP) . |
| 0 225 715 | 2/1996 | (EP) . |

(List continued on next page.)

OTHER PUBLICATIONS

Altera Brochure, 1995 Data Book, Flex 8000 Programmable Logic Device Family, pp. 52–55.

Bursky, Dave, "Combination RAM/PLD Opens New Application Options", May 23, 1991 (2 pgs.).

(List continued on next page.)

Primary Examiner—Michael Tokar
Assistant Examiner—Steven S. Paik
(74) Attorney, Agent, or Firm—Townsend and Townsend and Crew LLP

(57) ABSTRACT

An integrated circuit for implementing reconfigurable logic, such as a field programmable gate array ("FPGA"), as described herein has flexible input/output buffer circuits. These input/output buffer circuits transfer data either bidirectionally or unidirectionally between an input/output pin and a FPGA core. Each input/output buffer circuit allows at least two signals to be time-multiplexed onto an input/output pin thereby doubling the effective input/output capacity. The input/output buffer circuits may be used to time-multiplex at least two signals onto an input pin, at least two signals onto an output pin, or both. Each input/output buffer circuit further has shared flip flops for time-multiplexing signals. The circuitry provides two connections into the FPGA core which can be used to time-multiplex at least two independent inputs or outputs.

19 Claims, 4 Drawing Sheets

U.S. PATENT DOCUMENTS

| | | |
|---|---|---|
| 5,122,685 | 6/1992 | Chan et al. . |
| 5,212,666 | 5/1993 | Takeda . |
| 5,231,312 | 7/1993 | Gongwer et al. . |
| 5,276,842 | 1/1994 | Sugita . |
| 5,313,119 | 5/1994 | Cooke et al. . |
| 5,315,178 | 5/1994 | Snider . |
| 5,329,460 | 7/1994 | Agrawal et al. . |
| 5,329,493 | 7/1994 | Meyer et al. . |
| 5,343,406 | 8/1994 | Freeman et al. . |
| 5,352,940 | 10/1994 | Watson . |
| 5,375,089 | 12/1994 | Lo . |
| 5,384,500 | 1/1995 | Hawes et al. ............................ 326/39 |
| 5,386,155 | 1/1995 | Steele et al. ............................ 326/37 |
| 5,408,434 | 4/1995 | Stansfield . |
| 5,412,260 | 5/1995 | Tsui et al. ............................... 326/39 |
| 5,414,377 | 5/1995 | Freidin . |
| 5,426,378 | 6/1995 | Ong . |
| 5,530,670 | 6/1996 | Matsumoto . |
| 5,550,782 | 8/1996 | Cliff et al. ........................ 365/230.03 |
| 5,566,123 | 10/1996 | Freidin et al. . |
| 5,572,148 | 11/1996 | Lytle et al. . |
| 5,594,367 * | 1/1997 | Trimberger et al. .................... 326/41 |
| 5,596,742 | 1/1997 | Agarwal et al. ....................... 395/500 |
| 5,659,716 * | 8/1997 | Selvidge et al. ........................ 703/23 |
| 5,668,771 | 9/1997 | Cliff et al. . |
| 5,809,281 | 9/1998 | Steele et al. . |
| 5,811,985 * | 9/1998 | Trimberger et al. .................... 326/38 |
| 5,835,405 | 11/1998 | Tsui et al. . |
| 5,847,578 * | 12/1998 | Noakes et al. .......................... 326/39 |
| 5,852,608 | 12/1998 | Csoppenszky et al. . |
| 5,869,979 * | 2/1999 | Bocchino ................................ 326/38 |
| 6,020,760 * | 2/2000 | Sample et al. .......................... 326/41 |

FOREIGN PATENT DOCUMENTS

| | | |
|---|---|---|
| 01091525 | 4/1989 | (JP) . |
| 01091526 | 4/1989 | (JP) . |
| 92/15152 | 9/1992 | (WO) . |
| WO 94/10754 | 5/1994 | (WO) . |

OTHER PUBLICATIONS

Masumoto, Rodney T., "Configurable On–Chip RAM Incorporated into High Speed Logic Array," IEEE Custom Integrated Circuits Conference, Jun. 1985, CH2157–6/85/0000–0240, pp. 240–243.

Landry, Steve, "Application —Specific ICs, Relying on RAM, Implement Almost Any Logic Function," Electronic Design, Oct. 31, 1985, pp.123–130.

Bursky, Dave, "Shrink Systems with One–Chip Decoder, EPROM, and RAM," Electronic Design, Jul. 28, 1988, pp. 91–94.

Kawana, Keiichi et al., "An Efficient Logic Block Interconnect Architecture for User–Reprogrammable Gate Array," IEEE 1990 Custom Integrated Circuits Conf., May 1990 CH2860–5/90/0000–0164, pp. 31.3.1 to 31.3.4.

Shubat, Alexander et al., "A Family of User–Programmable Peripherals with a Functional Unit Architecture," IEEE Jor. of Solid–State Circuits, vol. 27, No. 4, Apr. 1992, 0018–9200/92$03.00, pp. 515–529.

"AT&T's Orthogonal ORCA Targets the FPGA Future," 8029 Electronic Engineering, 64, No. 786, Jun. 1992, pp. 9–10.

Bursky, Dave, "FPGA Advances Cut Delays, Add Flexibility," 2328 Electronic Design, 40, No. 20, Oct. 1, 1992, pp. 35–43.

Smith, Daniel, "Intel's FLEXlogic FPGA Architecture," IEEE 1063–6390/93, 1993 pp. 378–384.

Bursky, Dave, "Denser, Faster FPGAs Vie for Gate–Array Applications," 2328 Electronic Design, 41, No. 11, May 27, 1993, pp. 55–75.

Ngai, Kai–Kit Tony, "An SRAM–Programmable Field–Reconfigurable Memory," University of Toronto, Canada, Jun. 1994, UMI Dissertation Services, pp. 1–68.

Kautz, "Cellular Logic in Memory Arrays," IEEE Trans. on Computers, vol. C–18, No. 8, Aug. 1969, pp. 719–727.

Stone, "A Logic in Memory Computer," IEEE Trans. on Computers, Jan. 1970, pp. 73–78.

Manning, "An Approach to Highly Integrated Computer Maintained Cellular Arrays," IEEE Trans. on Computers, vol. C–26, No. 6, Jun. 1977, pp. 536–552.

Patil et al., "A Programmable Logic Approach for VLSI," IEEE Trans. on Computers, vol. C–28, No. 9, Sep. 1979, pp. 594–601.

Seitz, "Concurrent VLSI Architectures," IEEE Trans. on Computers, vol. C–33, No. 12, Dec. 1984, pp. 1247–1265.

Hsieh et al., "Third Generation Architecture Boosts Speed and Density of Field Programmable Gate Arrays," Proc. of IEEE CICC Conf., May 1990, pp. 31.2.1 to 31.2.7.

Bursky, "Combination RAM/PLD Opens New Application Options," Electronic Design, May 23, 1991, pp. 138–140.

Ling et al., "WASMII: A Data Driven Computer on a Virtual Hardware," Proc. of IEEE Field Prog. Custom Computing Machines Conf., Napa, California, Apr. 1993, pp. 33–42.

Casselman, "Virtual Computing and The Virtual Computer," IEEE, Jul. 1993, p. 43.

Quenot et al., "A Reconfigurable Compute Engine for Real–Time Vision Automata Prototyping," Proc. ofIEEE FCCM Conf., Napa, California, Feb. 1994, pp. 91–100.

Plus Logic "FPSL5110 Intelligent Data Buffer" Product Brief, Plus Logic, Inc., San Jose, California, Oct. 1990, pp. 1–6.

Intel Preliminary Datasheet, "iFX780: 10ns FLEXlogic FPGA with SRAM Option," Nov. 1993, p. 2–24 to 2–46.

Quinnell, Richard A., "FPA Family Offers Speed, Density, On–chip RAM, and Wide–Decode Logic, "EDN Dec. 6, 1990, pp. 62–63.

Satoh, Hisayasu et al., "A 209K–Transistor ECL Gate Array with RAM," IEEE Jor. of Solid–State Circuits, vol. 24, No. 5, Oct. 1989, pp. 1275–1279.

* cited by examiner

US 6,285,211 B1

I/O BUFFER CIRCUIT WITH PIN MULTIPLEXING

SPECIFICATION

This application is a continuation of U.S. patent application Ser. No. 08/895,470, filed Jul. 16, 1997, now U.S. Pat. No. 6,020,760 which is incorporated by reference.

TECHNICAL FIELD

The present invention relates in general to input/output (I/O) buffer circuits, and is specifically directed to an I/O buffer circuit for a field programmable gate array wherein two logical signals are multiplexed onto each physical I/O pin of each I/O buffer circuit such that the I/O capacity of the FPGA is effectively doubled. I/O buffer circuits constructed in accordance with the present invention are thus applicable to FPGAs designed for use in hardware logic emulation systems.

BACKGROUND OF THE INVENTION

Field programmable gate arrays (FPGAs) are devices which can be arbitrarily programmed to implement a wide variety of logic circuit designs. An FPGA typically contains an array of logic blocks, each of which can be configured to perform selected logic functions in response to the programming of the FPGA. Individual logic blocks are configured to represent the individual elements of the logic circuit design being implemented. I/O pins on the FPGA carry data, control and clock signals to and from the configured logic blocks as required by the implemented circuit design.

The size of a circuit design which can be implemented in an FPGA depends on the number of logic blocks in the FPGA and the number of I/O pins available to the FPGA for use in implementing the circuit design. I/O pin count is a function of the perimeter dimension of the FPGA and the distance between I/O pads required by existing wirebonding equipment. Hence, the number of I/O pins on a given FPGA is proportional to die size, and only increases relatively slowly with advances in assembly equipment. The number of logic blocks which can be placed on an FPGA, however, is proportional to the square of the die size and is growing rapidly as the size of functional devices which can be fabricated on silicon continues to shrink. Continued reduction in the physical dimensions of integrated circuit devices such as FPGAs is therefore imposing a severe bottleneck with respect to I/O pin availability. Under these circumstances, it would be desirable to provide a means for reducing or avoiding the I/O availability bottleneck which otherwise limits the size of circuit designs which can be implemented in an FPGA.

SUMMARY OF THE INVENTION

The present invention time-multiplexes at least two signals onto a single input/output pin, thereby increasing the effective I/O capacity.

A first, separate aspect of the present invention is a design that maximizes the effective I/O pin availability in a field programmable gate array.

A second, separate aspect of the present invention is an efficient structure and technique for time-multiplexing signals on the I/O pins of a circuit used to implement reconfigurable logic.

A third, separate aspect of the present invention is an efficient structure and technique for transferring multiple input or output signals over a single I/O pin of a field programmable gate array.

A fourth, separate aspect of the present invention is an input/output buffer circuit that time-multiplexes signals onto an I/O pin and provides a delay element for adding delay to a signal as needed.

A fifth, separate aspect of the present invention is an input/output buffer circuit that provides two different paths from the I/O pin to the core and two different paths from the core to the I/O pin, both of which can be time-multiplexed.

In the preferred embodiment, these and other aspects of the present invention are achieved with a reconfigurable I/O buffer circuit which can be used in a field programmable gate array, wherein the buffer circuit is connected to the FPGA core via two circuit paths and drives one physical I/O pin. The I/O buffer circuit can be selectively configured in a manner which enables the two core circuit paths to provide bidirectional I/O capability. Alternately, the I/O buffer circuit of the present invention can be reconfigured to provide for time multiplexing of at least two input signals or two output signals onto the same physical I/O pin. Buffer circuit reconfigurability requires only two flip-flops in the I/O buffer circuit cell. The I/O buffer circuit can also swap signals between the two core connections to provide additional I/O routing flexibility.

BRIEF DESCRIPTION OF THE DRAWINGS

The various objects, features and advantages of the present invention will be better understood by examining the descriptive Detailed Description of the Preferred Embodiment found below, together with the attached Drawings, in which.

DETAILED DESCRIPTION OF THE PREFERRED EMBODIMENT

The present invention comprises an I/O buffer circuit which can be configured as a registered or combinational functional block with the following signal path options: (a) single input, (b) multiplexed inputs, (c) single output, (d) multiplexed outputs, or (e) bidirectional. The details of the I/O buffer circuit and manner in which it is programmed to provide various signal path options will now be explained.

Figure 1:
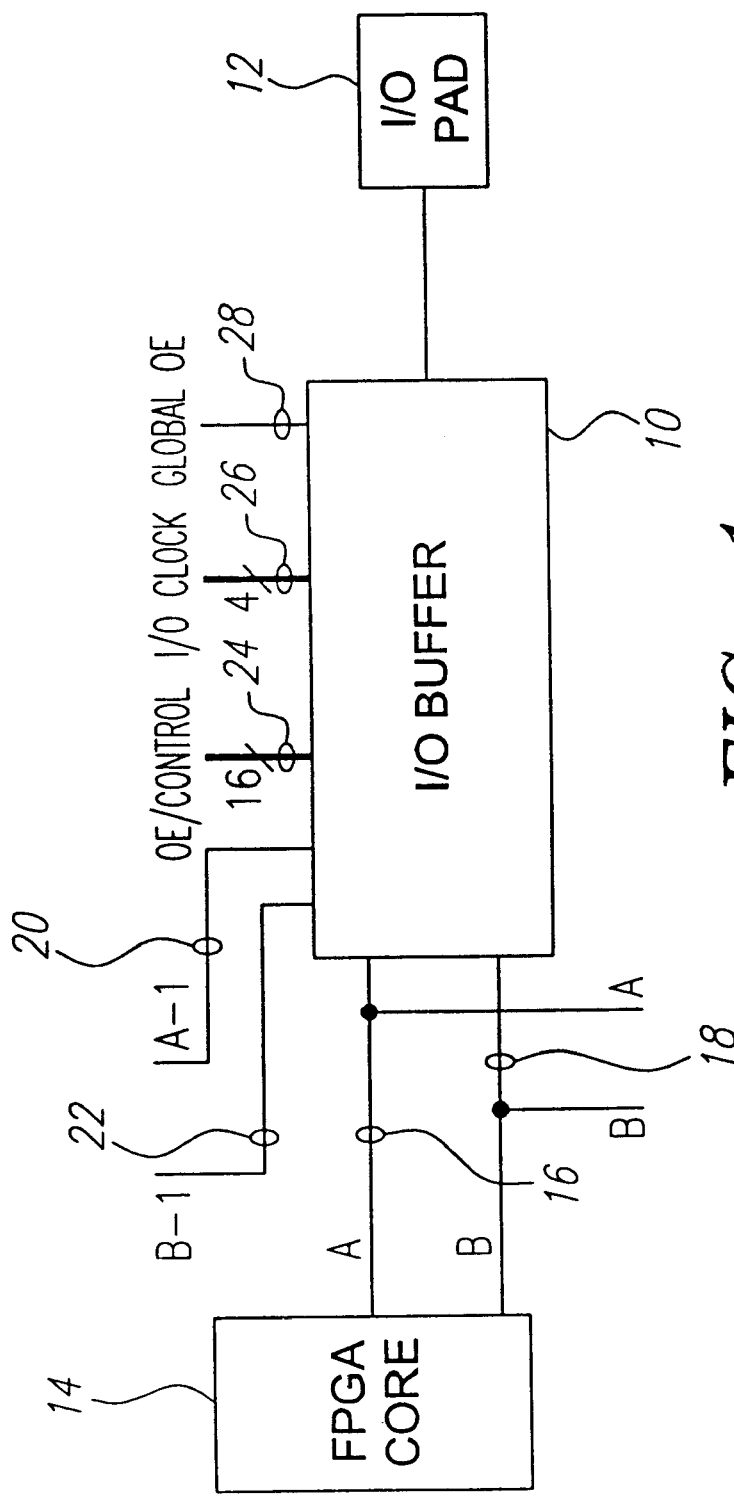
FIG. 1 depicts the external connections to the I/O buffer circuit of the present invention, and shows the various buffer circuit data, control and clock signal paths.

The external connections to the I/O buffer circuit 10 of the present invention can be seen in FIG. 1. In a preferred embodiment of the present invention, I/O buffer circuit 10 is incorporated in a field programmable gate array, although one of ordinary skill in the art could adapt the I/O buffer circuit 10 for use with other types of integrated circuit devices where I/O buffer reconfigurability is desirable.

Each I/O buffer circuit 10 is connected to one physical I/O pad 12. I/O buffer circuit 10 is also connected to the FPGA core 14 through a pair of core connections 16, 18. Core connections 16, 18 respectively carry A and B signals, which may be defined as either input or output signals depending upon the configuration of the I/O buffer circuit 10. Signals transmitted out of the core may also be referred to as "core signals." In some configurations, the I/O buffer circuit may also "steal" A and B signals, respectively designated A-1 and B-1 signals, from adjacent I/O buffer circuits using connections 20 and 22. The A and B signals pass through core connections 16, 18 which are dedicated for use by the I/O buffer circuit, while the A-1 and B-1 signals pass through core connections 20, 22 which are alternative connections for use by the I/O buffer circuit if the adjacent I/O buffer circuit is not using the alternative core connections.

The I/O buffer circuit configuration is governed by a series of output enable and control signals on OE/Control bus 24, a series of I/O clock signals on I/O Clock bus 26 and a global output enable signal on Global OE connection 28. In a preferred embodiment of the present invention, there are sixteen output enable and control signals, four I/O clock signals and one global output enable signal respectively carried on OE/Control bus 24, I/O Clock bus 26 and Global OE connection 28.

Although only one I/O buffer circuit 10 is shown in FIG. 1, it should be understood that a typical FPGA will contain as many I/O buffer circuits as there are FPGA I/O pads. OE/Control bus 24, I/O Clock bus 26 and Global OE connection 28 supply enable, control and clock signals to all of the I/O buffer circuits in the FPGA.

It should be further understood that only the signals accessible to the user of the FPGA are illustrated in FIG. 1. Other internal FPGA signals such as power, test and loading configuration signals are not shown, but, as would be apparent to one of ordinary skill in the art, are nevertheless present in the I/O buffer circuit of FIG. 1.

Figure 2:
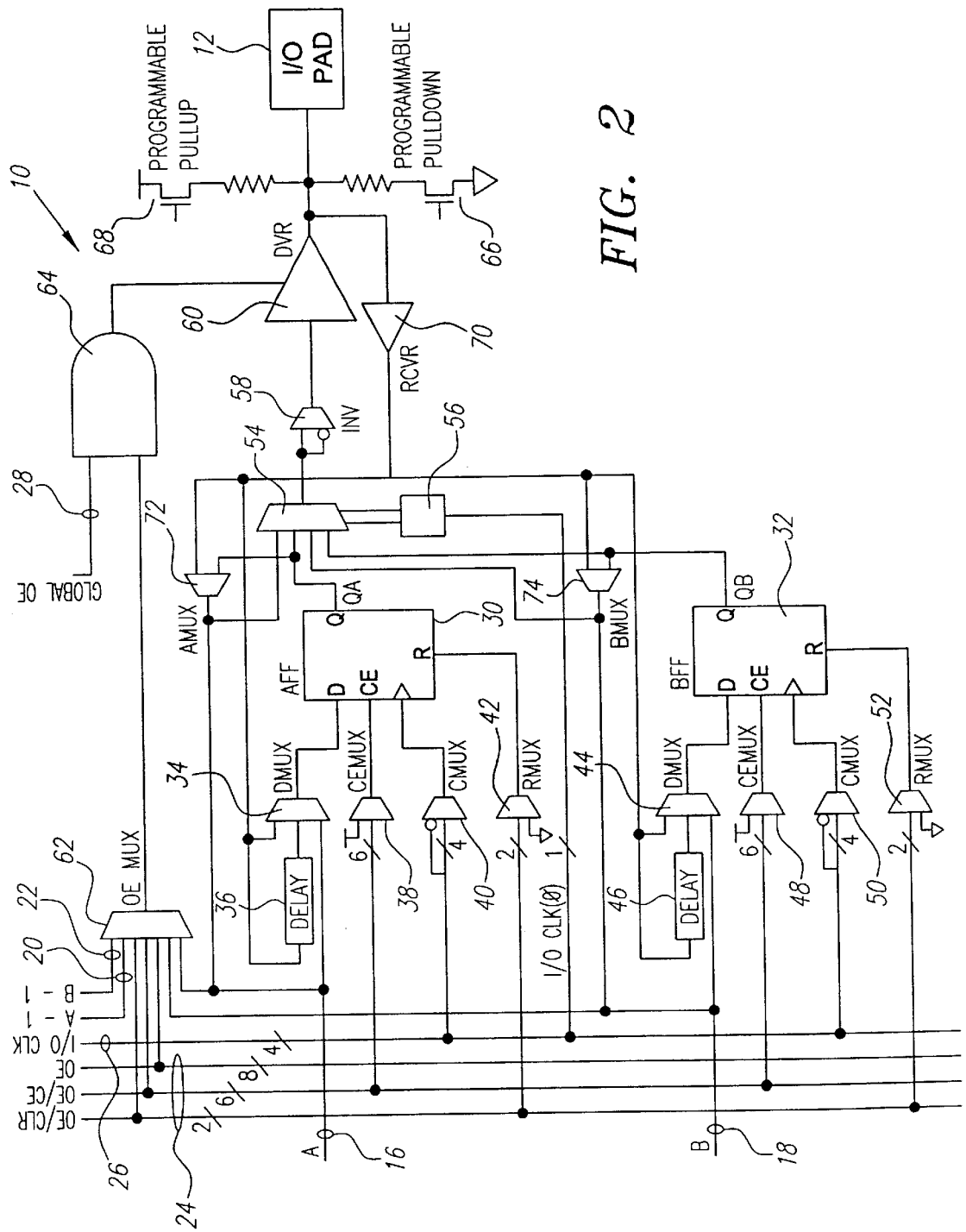
FIG. 2 is a block diagram of the I/O buffer circuit of FIG. 1.

Turning to FIG. 2, a schematic block diagram of I/O buffer circuit 10 can be seen. Buffer circuit 10 includes a first latch circuit which includes an A flip-flop register 30 and a second latch circuit which includes a B flip-flop register 32. The A flip-flop register 30 receives data-in signals generated from a data multiplexer (D MUX) 34. The inputs to data multiplexer 34 are supplied from the FPGA core via core connection 16, or, as will be described in greater detail below, from I/O pad 12 either directly or through a delay element 36. The Q output of A flip-flop register 30, designated QA in FIG. 2 to indicate its association with the A signal path of I/O buffer circuit 10, is directed to either I/O pad 12 or core connection 16, depending, as will be described in greater detail below, upon whether the I/O buffer circuit has been programmed in an output or input configuration.

Clock enable logic for the A flip-flop 30 consists of logical or pin driven clock enable (CE) signals received from the Output Enable/Control bus 24 through clock enable multiplexer (CE MUX) 38. In a preferred embodiment of the present invention, up to six clock enable signals are available, and clock enable multiplexer 38 comprises a 6:1 multiplexer. A separate input to multiplexer 38 can be tied logical high, providing a constant logic "one" to the A flip-flop clock enable pin if desired by the FPGA user.

The A flip-flop register 30 is clocked by the output of a clock multiplexer (C MUX) 40, which is itself tied to the I/O Clock bus 26. In a preferred embodiment of the present invention, the clock logic for A flip-flop 30 can consist of up to four logical or pin driven clock (I/O CLK) signals, and clock multiplexer 40 is a 4:1 multiplexer with polarity control.

Finally, reset multiplexer (R MUX) 42 supplies A flip-flop register 30 with a reset signal, which in the preferred embodiment of the present invention consists of up to two logical or pin driven clear (CLR) signals from the Output Enable/Control bus 24. A separate input to multiplexer 42 can be tied to ground, providing a constant logic "zero" to the A flip-flop reset pin if desired by the FPGA user.

B flip-flop register 32 utilizes an input configuration which mirrors the input configuration of A flip-flop register 30. That is, data-in signals for B flip-flop register 32 are generated from data multiplexer 44, which in a preferred embodiment is a 3:1 multiplexer, using inputs supplied either by B connection 18 or I/O pad 12 directly or through delay element 46. The Q output of B flip-flop register 32, designated QB in FIG. 2 to indicate its association with the B signal path of I/O buffer circuit 10, is directed to either I/O pad 12 or core connection 18, again depending upon whether the I/O buffer circuit has been programmed in an output or input configuration.

Clock enable logic for the B flip-flop register 32 consists of clock enable (CE) signals supplied by the Output Enable/Control bus 24 through clock enable multiplexer 48. The clock input of B flip-flop register 32 is driven by clock logic in the form of I/O CLK clock signals from the I/O Clock bus 26 through polarity-controlled clock multiplexer 50. The reset pin of B flip-flop register 32 receives clear (CLR) signals from the Output Enable/Control bus 24 through reset multiplexer 52.

The I/O buffer circuit of FIG. 2 provides several output paths, each of which selectively passes through output multiplexer (OUTPUT MUX) 54 under the control of an output multiplexer controller 56. As can be seen in FIG. 2, output multiplexer 54 can select either the A combinatorial output from the FPGA core (via core connection 16), the B combinatorial output from the FPGA core (via core connection 18)., the QA output of A flip-flop register 30 or the QB output of B flip-flop register 32. Output multiplexer 54 is in turn connected to a programmable output inverter (INV) 58 and an I/O output driver (DVR) 60.

Output driver 60 is a slew rate controlled tri-state driver, itself under the control of output enable logic consisting of an output enable multiplexer (OE MUX) 62 connected to one input of AND gate 64. The other input to AND gate 64 is supplied by the global output enable signal along Global OE connection 28. Output enable multiplexer 62 can select among any of the output enable (OE) signals on bus 24 or any of the A, B, A-1 or B-2 signals generated as an output enable logic signal in the FPGA core and dedicated for that purpose on connections 16–22. By driving one of the OE or dedicated A, B, A-1 or B-1 signals high and selecting that signal, the output enable multiplexer 62 supplies a logic true to one input of AND gate 64. If the global output enable signal on Global OE connection 28 is also high or logic true, AND gate 64 will output a control signal which renders I/O output driver 60 active. Thereafter, output driver 60 will drive the selected A, B, QA or QB signal from output multiplexer 54 to I/O pad 12.

Alternately, if either the global output enable signal on connection 28 or the signal from output enable multiplexer 62 is low or logic false, the output from AND gate 64 is driven low to disable I/O output driver 60. The latter condition is useful, for example, for providing a default on I/O pad 12 during FPGA power-up conditions.

Connecting the A-1 and B-1 signals to output enable multiplexer 62 via connections 20 and 22 allows the user to "steal" output enable control signals from adjacent I/O buffer circuits when the I/O buffer circuit 10 of FIG. 2 is configured as a bidirectional I/O buffer and all of the lines in OE/Control bus 24 are otherwise dedicated. Under such circumstances, the A core connection 16 and B core connection 18 of the I/O buffer circuit are actively used to carry the input and output portions of a bidirectional signal, and the output enable logic for output driver 60 must receive output enable control signals from somewhere else. If an adjacent I/O buffer circuit has been configured to provide a static input or static output, requiring only one A or B core connection in the adjacent I/O buffer circuit, the unused A or B connection from the adjacent I/O buffer circuit can be "stolen" and used to supply output enable control signals via output enable multiplexer 62 in I/O buffer circuit 10.

Output driver 60 is also capable of providing two additional output options. By driving either the A signal on core connection 16 or the B signal on core connection 18 to a fixed logic level, either high or low, and suitably programming output inverter 58 which receives the fixed A signal or the fixed B signal through output multiplexer 54, the signals supplied to output driver 60 from output inverter 58 can be tied to either a logic high or logic low. If a data signal is then driven from core connection 16 (A) or 18(B) through output enable multiplexer 62 and AND gate 64 to the output enable pin of output driver 60, the output from output driver 60 at I/O pad 12 may be rendered either open-collector or open-emitter. In addition, a programmable pulldown transistor 66 and programmable pullup transistor 68 connected to the output of driver 60 can be programmed to provide either pulldown or pullup conditions at I/O pad 12.

When configured for an input mode of operation, I/O buffer circuit 10 of FIG. 2 provides two input signal paths. These two input signal paths respectively route either the A or B signal from I/O pad 12 through I/O buffer circuit 10 and core connections 16, 18 to the FPGA core array. For input purposes, I/O pad 12 is connected to an I/O input receiver (RCVR) 70. In the preferred embodiment of the present invention, I/O input receiver 70 comprises a CMOS/TTL Schmitt trigger buffer. A signal may be driven through core connection 16 into the FPGA core by an A-input multiplexer (A MUX) 72, which can select from either the I/O input receiver 70 or the QA output of A flip-flop register 30. If the QA output of A flip-flop register 30 is selected by A-input multiplexer 72, the signal from I/O input receiver 70 is first clocked through the A flip-flop register 30 via either the data-in multiplexer 34 or the delay element 36 in combination with data-in multiplexer 34. (When core connection 16 is used to provide an output from core 14 rather than an input, A-input multiplexer 72 may be disabled.)

Similarly, core connection 18 is driven by a B-input multiplexer (B MUX) 74 which selects either the direct signal from I/O input receiver 70 or the QB output of B flip-flop register 32, which latter signal represents the signal from I/O input receiver 70 clocked through B flip-flop register 32 via either data-in multiplexer 44 or data-in multiplexer 44 in combination with delay element 46. (When core connection 18 is used to provide an output from core 14 rather than an input, B-input multiplexer 74 may be disabled)

As can now be seen, the input configuration of I/O buffer circuit 10 increases the availability of input signal paths for the FPGA, inasmuch as it provides two different means for routing signals between I/O pad 12 and the FPGA core.

Figure 3:
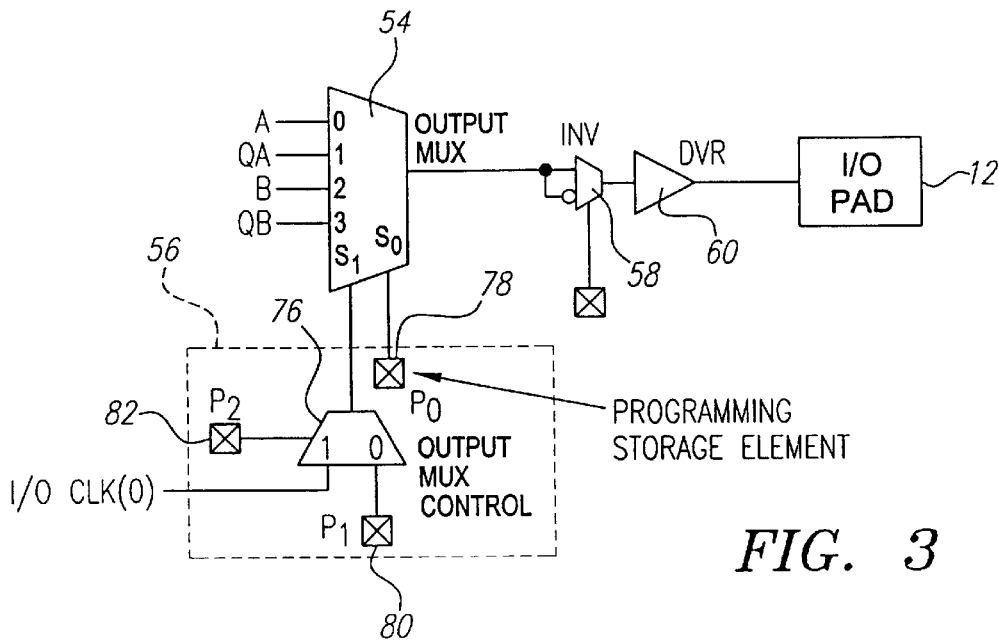
FIG. 3 provides a detailed view of the output multiplexer control of the I/O buffer circuit of FIG. 2.

The output multiplexer controller 56 which controls the selection activity of output multiplexer 54 in I/O buffer circuit 10 is described in greater detail in connection with FIG. 3. As can be seen in FIG. 3, output multiplexer 54 selects from among the A and B signals on core connections 16 and 18 and the QA and QB outputs from the A flip-flop and B flip-flop registers 30, 32. As described above, the signal selected by output multiplexer 54 is driven through the programmable output inverter 58 to the output driver 60 and I/O pad 12.

Output multiplexer selection is accomplished according to the status of output multiplexer selection inputs $S_0$ and $S_1$ supplied by output multiplexer controller 56. Output multiplexer controller 56 includes a control multiplexer 76 and three programming storage cells 78, 80 and 82 which respectively hold $P_0$, $P_1$, and $P_2$ configuration bits. Programming storage cell 78 is connected directly to selection input $S_0$ of output multiplexer 54. Programming storage cell 80 provides one of the inputs to control multiplexer 76, while the other input to the control multiplexer is provided by the I/O CLK (0) clock signal from the "0" line of I/O clock bus 26. Programming storage cell 82 governs the signal selection of the control multiplexer 76.

In a preferred embodiment of the present invention, when programming storage cell 82 is loaded with a single configuration bit $P_2$ of "zero" logic value, the configuration bit $P_1$ in programming storage element 80 is selected by control multiplexer 76 and passes to the $S_1$ selection input of output multiplexer 54, which selects from among signals A, B, QA and QB in accordance with the logic states of the $P_0$ and $P_1$ configuration bits in programming storage cells 78 and 80. When the $P_2$ configuration bit in programming storage cell 82 equals a logic "one", the I/O CLK (0) clock signal passes through control multiplexer 76 to the $S_1$ selection input of output multiplexer 54, whereupon the state of the I/O CLK (0) clock signal determines which signal the output multiplexer selects for driving programmable inverter 58 and output driver 60. In particular, if configuration bit $P_0$ in programming storage cell 78 is set to a logic "one", output multiplexer 54 will select the QA signal from A flip-flop register 30 when the I/O CLK (0) signal is a logic zero, but will select the QB output from the B flip-flop register 32 when the I/O CLK (0) is equal to a logic one. Consequently, the QA and QB outputs of the A and B flip-flop registers 30, 32 can be time-multiplexed onto the I/O pad 12.

Table I which follows illustrates in greater detail the status of the configuration bits in programming storage cells 78–82 and corresponding outputs from output multiplexer 54:

TABLE I

| $P_2P_1P_0$ | Output Multiplexer Selection |
|---|---|
| 000 | A |
| 001 | QA |
| 010 | B |
| 011 | QB |
| 100 | A(I/O CLK(0)=0)/B(I/O CLK(0)=1) |
| 101 | QA(I/O CLK(0)=0/QB(I/O CLK(0)=1) |
| 110 | A(I/O CLK(0)=0)/B(I/O CLK(0)=1) |
| 111 | QA(I/O CLK(0)=0)/QB(I/O CLK(0)=1) |

Returning to FIG. 2, the operational characteristics of all the remaining components in the I/O buffer circuit 10, including signal selection in the remaining multiplexers, are controlled by programming storage cells similar to programming storage cells 78–82 in FIG. 3. These programming storage cells are not shown, but would be implemented in conventional fashion as those skilled in the FPGA art understand. Each programming storage cell holds a single configuration bit of the same type as those used elsewhere in the FPGA. The FPGA user determines the configuration of the various I/O buffer circuit components by loading configuration bits into the programming storage cells, again as is well known and apparent to those of ordinary skill in the FPGA art, whereupon each programming storage cell provides a control signal for, e.g., enabling or disabling a particular I/O buffer circuit feature, selecting a particular multiplexer input, activating a delay circuit or the like.

For example, the data-in multiplexers 34 and 44, reset multiplexers 42 and 52 and A- and B-input multiplexers 72 and 74 all require two configuration bits to select between the various multiplexer inputs or enable features, and all employ two programming storage cells. The clock enable multiplexers 38, 48 and the clock multiplexers 40, 50 require three configuration bits to select between inputs and thus employ three programming storage cells. In a preferred embodiment of the present invention, the output enable multiplexer 62 selects from among 20 different inputs (16 OE lines from bus 24, the A and B signals from core connections 16 and 18 and the A-1 and B-1 signals from connections 20 and 22), and thus requires five configuration bits with five corresponding programming storage cells. One configuration bit in one programming storage cell is required for determining the output state of programmable inverter 58. Similarly, one configuration bit in one programming storage cell determines whether the I/O input receiver 70 operates in either a CMOS or TTL mode. Finally, single configuration bits held in single programming storage cells are used to control programmable pulldown transistor 66 and programmable pullup transistor 68. The relationships between inputs and configuration bits for the various multiplexers are summarized in Table II.

TABLE II

| Multiplexer | Inputs | CONFIG bits |
| --- | --- | --- |
| INV 58 | 2 | 1 |
| D MUX 34, 44 | 3 | 2 |
| R MUX 42, 52 | 3 | 2 |
| A/B MUX 72, 74 | 2 + enable | 2 |
| CE MUX 38, 48 | 7 | 3 |
| C MUX 40, 50 | 8 | 3 |
| OE MUX 62 | 20 | 5 |

As can be seen, then, the FPGA user determines the configuration of I/O buffer circuit 10 by loading configuration bits into the various programming storage cells associated with the various components which comprise the I/O buffer circuit as described above. Each such programming storage cell provides a single control signal which enables or disables various features of the programmable elements, selects a multiplexer input or the like in a manner well understood and readily apprehended by those of ordinary skill in the FPGA art.

The reconfigurable nature of I/O buffer circuit 10 will now be explained in further detail. When configuration bit $P_2$ in programming storage cell 82 of output multiplexer control 56 is loaded with a logic "zero" as described above, I/O buffer circuit 10 operates in a non-multiplexed mode. The A and B signal paths through the I/O buffer circuit can be used for several different functions, depending upon the configuration of the remainder of the I/O buffer circuit components.

More specifically, the I/O buffer circuit 10 can be configured to output either the A or B signal from the FPGA core by suitable programming of output multiplexer 54, output inverter 58, and output driver 60. Tristate drive control is achieved using the output enable logic consisting of output enable multiplexer 62 together with AND gate 64, as described above. Conversely, if the I/O buffer circuit is to serve as an input for A or B signals, I/O input receiver 70, A-input multiplexer 72 and B-input multiplexer 74 are suitably programmed. The A flip-flop and B flip-flop registers 30, 32 can be inserted into the A and B signal paths when the I/O buffer circuit is in either its input or output configuration, in conjunction with-the appropriate combination of A- and B-input multiplexers 72 and 74, data-in multiplexers 34 and 44, and/or output multiplexer 54.

Bidirectional operation of I/O buffer circuit 10 in a non-multiplexed mode is also available, with either the A or B signal assigned to input and output. Bidirectional output enable control is achieved through suitable arrangement of the output enable (OE) signals on OE/Control bus 24 and the global output enable signal on Global OE connection 28.

When the $P_2$ configuration bit in programming storage cell 82 of output multiplexer controller 56 is loaded with a logic "one", I/O buffer circuit 10 operates in a pin-multiplexed mode as described above. In this mode, the I/O buffer circuit may be configured to either: (i) output two multiplexed signals onto I/O pad 12, or (ii) input and demultiplex two signals from I/O pad 12.

Figure 4:
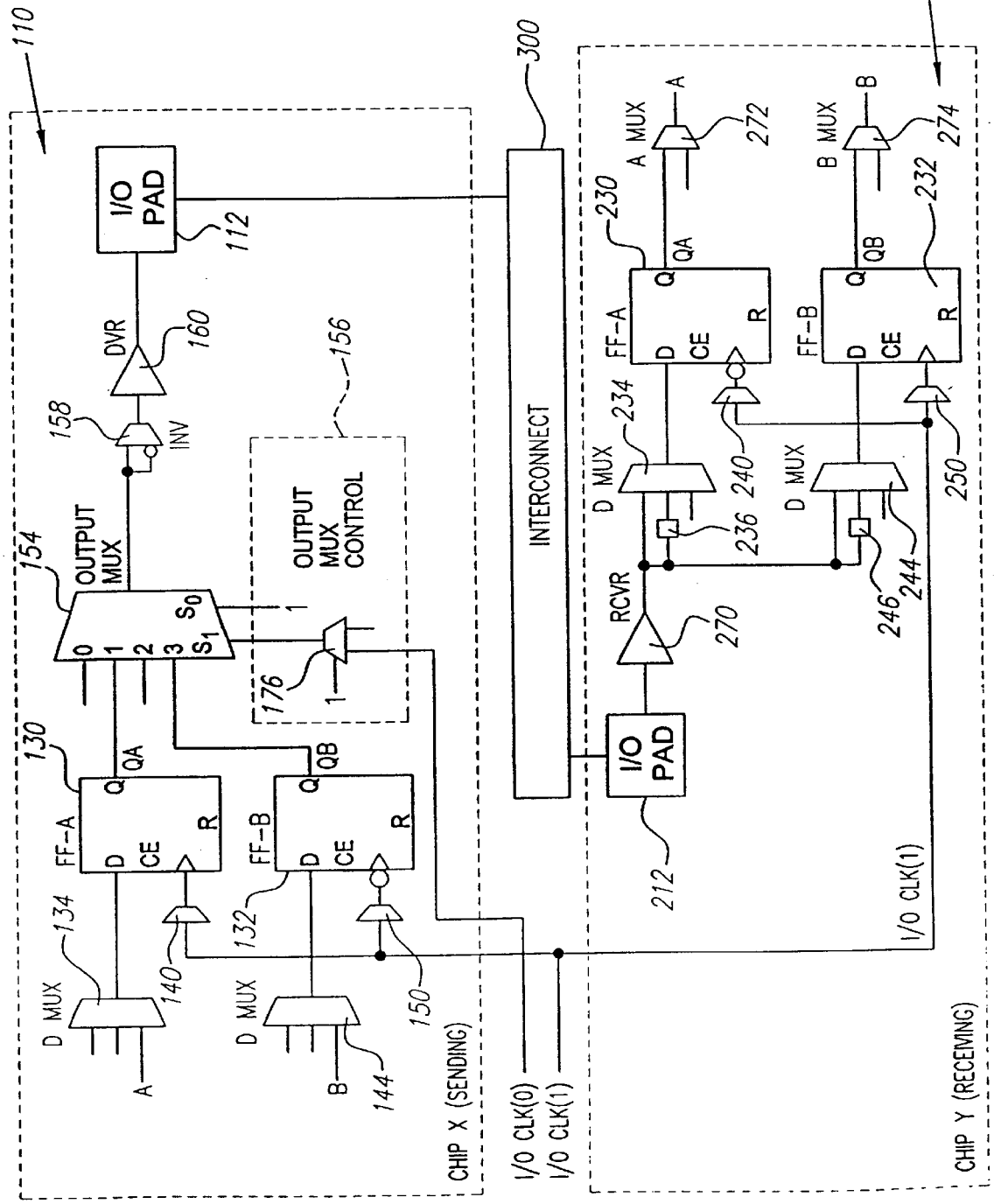
FIG. 4 illustrates an example of pin multiplexing operation using the I/O buffer circuit of the present invention in both a sending chip and a receiving chip.

An example of I/O pin multiplexing operation using the I/O buffer circuit technology of the present invention can be seen in FIG. 4, wherein I/O buffer circuit 110 configured as an output buffer for a "sending" chip (Chip X) outputs A and B signals in time-multiplexed fashion to I/O buffer circuit 210 configured as an input buffer on a "receiving" chip (Chip Y). Chip X and Chip Y each employ a single I/O pad 112 and 212. I/O pads 112, 212 are connected to one another via some form of interconnect structure 300 which may be hard-wired or programmable.

Each of the components of I/O buffer circuit 110 illustrated in FIG. 4 is programmed in an output configuration, as described above, while each of the components of buffer circuit 210 illustrated in FIG. 4 is programmed to an input configuration (as a convenience, only those components directly in the respective I/O buffer circuit signal paths are illustrated in FIG. 4).

Hence, in Chip X (the "sending" chip), the A and B signals generated by the FPGA core 14 (not shown in FIG. 4) are supplied to data-in multiplexers 134, 144 and regularly sampled by the A and B flip-flop. registers 130, 132. A and B flip-flop register sampling occurs in response to transitions in the I/O CLK(1) clock signal input directly to the A flip-flop register 130 through clock multiplexer 140 and in inverted fashion to the B flip-flop register 132 through clock multiplexer 150. Output multiplexer controller 156 on Chip X is configured such that the QA and QB outputs of A and B flip-flop registers 130, 132 are time-multiplexed through output multiplexer 154 in response to transitions of the I/O CLK(0) clock signal supplied to output multiplexer control 156 as described above in connection with FIG. 3. The time-multiplexed QA and QB signals subsequently pass through inverter 158 and output driver 160 to I/O pad 112 on Chip X, and thence to interconnect 300 (which may, as explained above, comprise either a fixed or programmable routing resource of the type employed in hardware logic emulation systems).

Time-multiplexed signals containing A and B values pass from interconnect 300 to I/O pad 212 on Chip Y (the "receiving" chip). From I/O pad 212, the signals are directed through input buffer/receiver 270 to data-input multiplexers 234, 244, respectively, and A and B flip-flop registers 230, 232 of the I/O buffer circuit 210 on Chip Y. Clock multiplexers 240, 250 respectively connected to the clock inputs of A and B flip-flop registers 230, 232 receive the I/O CLK(1) clock signal, with clock multiplexer 240 configured to invert the I/O CLK(1) clock signal at the clock input of A flip-flop register 230 while clock multiplexer 250 passes the I/O CLK(1) clock signal directly to the clock input of B flip flop register 232. As a result, A flip-flop register 230 regularly samples the time-multiplexed signals when the A value is present, causing the QA output of A flip-flop register 230 to follow the value of the A signal in Chip X. B flip-flop register 232 regularly samples the time-multiplexed signals when the B value is present, causing the QB output of B flip-flop register 232 to follow the value of the B signal in Chip X. The signals may then pass from the A multiplexer 272 or the B multiplexer 274 to the FPGA core 14.

In order to improve system timing, small delay elements 236, 246 may be respectively inserted in the input paths of the data-input multiplexers 234, 244 on Chip Y. This compensates for unavoidable skew between the I/O CLK (0) and I/O CLK (1) clock signals.

The time-multiplexed A/B signal on I/O pad 112 of Chip X may be fanned out to more than one receiving chip. The I/O buffer circuit in each receiving chip would be configured as shown in FIG. 4. In addition, when FPGAs incorporating the I/O buffer circuits of the present invention are interconnected in an FPGA array for use in a hardware logic emulation system, I/O CLK(0) and I/O CLK(1) clock signals are globally distributed to all of the FPGAs (not shown) in the array, in a manner which gives rise to low chip-to-chip skew.

Figure 5:
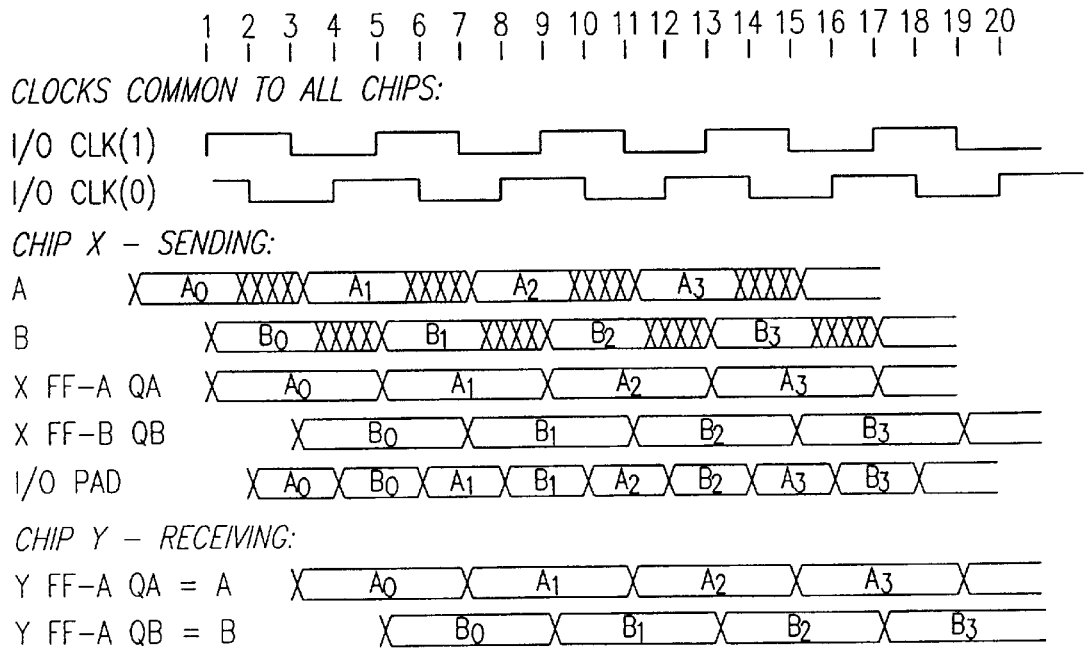
FIG. 5 depicts the pin-multiplexing signal waveforms generated by the I/O buffer circuit of the present invention.

FIG. 5 illustrates the signal waveforms associated with the Chip X/Chip Y configuration of FIG. 4. In Chip X (the "sending" chip), signal A changes from time to time, e.g., from value $A_0$ to $A_1$ to $A_2$, etc. Signal B in Chip X likewise changes from value $B_0$ to $B_1$ to $B_2$ and so on. Data-in multiplexer 134 is configured to send signal A to A flip-flop register 130 for sampling. Data-in multiplexer 144 is configured to send signal B to B flip-flop register 132 for sampling. Clock multiplexer 140 is programmed to clock A flip-flop register 130 on the rising edge of I/O CLK(1), whereas clock multiplexer 150 inverts I/O CLK(1) and clocks B flip-flop register 132 on the falling edges of the I/O CLK(1) signal. The A flip-flop register 130 accordingly samples signal A at times 1, 5, 9, . . . , yielding the QA output shown on line "X FF-A QA" of FIG. 5, and B flip-flop register 132 samples signal B at times 3, 7, 11, . . . , yielding the QB output shown on line "X FF-B QB" of FIG. 5.

Meanwhile, the I/O CLK(0) clock signal supplied to control multiplexer 176 in the output multiplexer controller 156 switches output multiplexer 154 between QA and QB outputs, driving the time-multiplexed signal at I/O pad 112 of Chip X, as illustrated on line "I/O Pad" of FIG. 5. Output multiplexer controller 156 is constructed such that output multiplexer 154 switches signal selection only between I/O CLK(1) clock signal edges, when the QA and QB outputs from A and B flip-flop. registers 130, 132 are both stable.

In Chip Y (the "receiving" chip), the same I/O CLK(1) clock signal clocks A and B flip-flop registers 230, 232 in a manner which demultiplexes the signal received at I/O pad 212. The clock multiplexers 240, 250 are programmed with a polarity opposite that of clock multiplexers 140, 150 on Chip X, such that A flip-flop register 230 samples the multiplexed signal on I/O pad 212 when the A value is present (i.e., at times 3, 7, 11, . . . ), and B flip-flop register 232 samples the multiplexed signal on I/O pad 212 when the B value is present (i.e., at times 5, 9, 13, . . . ). The QA output of A flip-flop register 230 is selected to drive signal A through the A-input multiplexer 272 and into the core of Chip Y. The QB output of B flip-flop register 232 is selected to drive signal B through the B-input multiplexer 274 and into the core of Chip Y.

Upon closer examination of FIG. 5, it becomes evident that the value of the A signal in Chip X at time 1 appears in the A signal of Chip Y at time 3, the value of the A signal in Chip X at time 5 appears as in the A signal of Chip Y at time 7, and so on continuously. Concurrently, the value of signal B in Chip X at time 3 appears in the B signal of Chip Y at time 5, its value in Chip X at time 7 appears in Chip Y at time 9, and so on.

The time-multiplexed A/B signal transmitted between the I/O buffer circuits of FIG. 4 is sampled by the A and B flip-flop registers in the buffer circuits at every other edge of the I/O CLK(1) clock signal. If the I/O CLK(l) signal waveform is symmetrical with a period equal to 2T, then time 2T elapses between samples. The values of the A and B signals in chip X therefore must not change more than once in any time 2T, or else a change in the values of the A and B signals may be missed. The maximum delay of a transition from an A/B signal in the sending chip (an FPGA in a preferred embodiment of the present invention) to the A/B signal in the receiving chip happens when the A or B value changes just after it is sampled. The new A/B value is sampled again after time interval 2T passes, and another time interval T is required to transmit the A/B signal to the receiving chip, so the maximum delay is time 3T. The minimum delay is time T.

The time-multiplexing performed by the I/O buffer circuit of the present invention is completely asynchronous relative to the timing of the A and B signals. If the time-multiplexing operation was synchronized to the timing of the A and B signals, it might be possible to reduce the maximum delay time. However, in a hardware logic emulation system which incorporates the I/O buffer circuit of the present invention, the I/O CLK clock signals are global to all FPGAs in the FPGA array and all signals in the FPGAs, and synchronizing I/O buffer circuit time-multiplexing to all signals can usually not be achieved. Since, in general, the I/O CLK(1) signal is asynchronous to sampled A and B signals in the sending chip, the setup and hold time requirements of the sampling A and B flip-flop registers will not always be met. In such cases, it is possible for the A and B flip-flop registers to enter a metastable state for an unknown but probabilistically predictable period. If that period is as long as time T minus the propagation delay time from the QA or QB output of the A or B is flip-flop registers in the sending chip to the data input of the A or B flip-flop registers in- the receiving chip, the sampled state at the receiving chip will be indeterminate. The clock periods must be chosen such that indeterminate sampled states, i.e., metastability events, are tolerably rare. This can be accomplished in current practice, with the result that an overly-long metastability event occurs with an average frequency of once in many years.

The minimum period of the I/O CLK(1) signal is determined by the time required to propagate from one clock edge, through the sampling flip-flop register, output multiplexer and I/O pad of the sending chip to the interconnect and the I/O pad, data-in multiplexer and data input and setup of the sampling flip-flop register in the receiving chip. If additional flip-flop registers clocked by I/O CLK(1) are introduced into the signal path, the clock period may be decreased, which would permit less minimum time between signal transitions.

Having disclosed in detail an exemplary embodiment of the present invention, it will be appreciated by those skilled in the art that numerous alternatives and equivalents exist which do not depart from the scope and spirit of the invention and, indeed, are intended to be covered by the appended claims. In this regard, a JTAG boundary scan cell (not shown, but constructed to IEEE standard 1149.1; six registers per I/O) can be provided for each I/O buffer circuit of the present invention. JTAG is a technique well known to those of ordinary skill in the FPGA art. Use of a conventional JTAG boundary scan cell provides the I/O buffer circuit with the ability to sample pin states or register states in response to receipt of an appropriate "snapshot" signal. Thereafter, the JTAG boundary scan cell can read out the sampled states. Registers in the I/O buffer circuit can also be synchronously loaded through a conventional JTAG boundary scan cell, based on receipt of a load signal.

Also, the I/O CLK(1) and I/O CLK(0) signals could be combined into a single signal. The preferred embodiment used two distinct clock signals because a more precise control of the system clock skew was found desirable in avoiding hold time problems between the sending and receiving chips.

By extending the teachings of the present invention, the input/output buffer circuit could be adapted to time-multiplex more than two signals onto an input/output pin if desired. Thus, 'n' different signals can be multiplexed onto one buffer circuit I/O pad. Each multiplexed signal needs a sampling flip-flop register in the sending chip and a demultiplexing flip-flop register in the receiving chip. Each sending chip further needs an 'n'-to-1 output multiplexer. A clock signal, or clock signals, which collectively exhibit at least 'n' different edges will then be distributed to all sending and receiving chips. Alternatively, one clock signal may be used, with clock enables employed to cause the correct sampling flip-flop registers to sample and demultiplex signals.

By way of example, the input/output buffer circuit of FIG. 4 (sending side) could include an additional data-in multiplexer (like 134, 144), an additional flip flop, a larger output multiplexer 154, an additional clock signal and other additional circuitry known to those skilled in the art to achieve time-multiplexing of three or more signals onto one input/output pin. The receiving side's input/output buffer circuit could be similarly adapted to include an additional data-input multiplexer (like 234, 244), an additional flip flop, an additional multiplexer (like 272, 274) and other additional circuitry. The number of configuration bits, such as those in FIG. 3 and Table I, could also be changed accordingly.

We claim:

1. An integrated circuit comprising:
    a field programmable gate array (FPGA) core;
    an input/output buffer circuit;
    an input/output pin coupled to the input/output buffer circuit;
    an output multiplexer capable of receiving "N" signals and time-multiplexing the "N" signals onto the input/output pin;
    an input multiplexer capable of receiving a time-multiplexed signal and de-multiplexing the time-multiplexed signal into "N" separate signals; and
    "N" bi-directional core connections between the FPGA core and the input/output buffer circuit for either transmitting signals from the FPGA core to the input/output buffer circuit or for transmitting signals from the input/output buffer to the FPGA core; and
    wherein "N" is any integer greater than 1.

2. A circuit for implementing re-configurable logic, comprising:
    a core;
    a connection to the core capable of transmitting a signal bi-directionally;
    an input/output pin capable of transmitting a signal bi-directionally;
    an input/output (I/O) buffer configured to receive a first signal from the connection and a second signal from the input/output pin, and to output the first signal to the input/output pin and the second signal to the connection in a time-multiplexed manner.

3. An integrated device for implementing re-configurable logic, comprising:
    a core;
    a first input/output buffer coupled to the core via a first connection and a second connection, the first and second connections capable of transmitting signals bi-directionally between the core and the first input/output buffer, the first input/output buffer capable of receiving a first signal from the core via the first connection and a second signal from the core via the second connection, and configured to time-multiplex the first and second signals onto an input/output pin.

4. The integrated device of 3 wherein the first input/output buffer is configured to transmit the first signal from the first connection to the input/output pin along a first path, and to transmit the second signal from the second connection to the input/output pin along a second path, wherein the first and second paths are substantially independent of each other.

5. The integrated device of 3 wherein the first input/output buffer is capable of receiving a third signal and a fourth signal via the input/output pin in a time-multiplexed manner, transmitting the third signal to the core via the first connection, and transmitting the fourth signal to the core via the second connection.

6. The integrated device of 5 wherein the first input/output buffer is configured to transmit the third signal to the first connection along a third path, and to transmit the fourth signal to the second connection along a fourth path, wherein the third and fourth paths are substantially independent of each other.

7. The integrated device of 5 wherein the first input/output buffer is capable of transmitting the third and fourth signals to the core after a programmable delay.

8. The integrated device of 5 wherein the first input/output buffer further comprises:
    a receiver configured to receive the third signal and the fourth signal;
    a first input multiplexer configured to receive the first signal from the first connection and the third signal from the receiver; and
    a second input multiplexer configured to receive the second signal from the second connection and the fourth signal from the receiver.

9. The integrated device of 8 wherein the first input/output buffer further comprises:
    a first flip-flop configured to receive the first signal and the second signal from the first input multiplexer;
    a second flip-flop configured to receive the third signal and the fourth signal from the second input multiplexer; and
    an output multiplexer configured to receive the first signal from the first flip-flop and the third signal from the second flip-flop.

10. The integrated device of 3 further comprising:
    a second input/output buffer coupled to the core via a third connection; and wherein the first input/output buffer is coupled to the third connection whereby the first input/output buffer may utilize the third connection when it is not being used by the second input/output buffer.

11. The integrated device of 10 wherein a signal received from the core via the third connection is used to control a mode of operation of the first input/output buffer.

12. The integrated device of 3 wherein the first input/output buffer is capable of time-multiplexing the first and second signals asynchronously relative to timings of the first and second signals.

13. A circuit for implementing reconfigurable logic, comprising:
   a first circuit comprising:
      a first core; and
      a first input/output buffer coupled to the first core via a first connection and a second connection, the first and second connections capable of transmitting signals bi-directionally between the first core and the first input/output buffer, the first input/output buffer capable of receiving a first signal from the first core via the first connection and a second signal from the first core via the second connection, and configured to time-multiplex the first and second signals onto an input/output pin; and
   a second circuit comprising:
      a second core; and
      a second input/output buffer coupled to the second core via a third connection and a fourth connection, the third and fourth connections capable of transmitting signals bi-directionally between the second core and the second input/output buffer, the second input/output buffer capable of receiving the first signal and the second signal from the input/output pin in a time-multiplexed manner, transmitting the first signal to the second core via the third connection, and transmitting the second signal to the second core via the fourth connection.

14. The circuit of claim 13 further comprising a clock that causes the first input/output buffer and the second input/output buffer to operate in a time-multiplexed manner.

15. The circuit of claim 13 wherein the input/output pin is capable of capable of transmitting signals bi-rectionally between the first input/output buffer and the second input/output buffer.

16. In an integrated circuit device comprising a core, an input/output buffer, and an input/output pin, a method of communicating signals between the core and the input/output pin, the method comprising:
   coupling the input/output buffer to the core via a first connection capable of transmitting a signal bi-directionally;
   receiving, at the input/output buffer, a first signal from the core via the first connection;
   receiving, at the input/output buffer, a second signal via the input/output pin; and
   outputting the first signal to the input/output pin and the second signal to the first connection in a time-multiplexed manner.

17. In an integrated circuit device comprising a core, an input/output buffer, and an input/output pin, a method of communicating signals between the core and the input/output pin, the method comprising:
   coupling the first input/output buffer to the core via a first connection and a second connection, the first and second connections capable of transmitting signals bi-directionally between the core and the first input/output buffer;
   receiving, at the first input/output buffer, a first signal from the core via the first connection;
   receiving, at the first input/output buffer, a second signal from the core via the second connection; and
   time-multiplexing the first and second signals onto the input/output pin.

18. The method of claim 17 further comprising:
   receiving, at the first input/output buffer, a third signal and a fourth signal via the input/output pin in a time-multiplexed manner,
   transmitting the third signal to the core via the first connection; and
   transmitting the fourth signal to the core via the second connection.

19. The method of claim 17 further comprising:
   coupling a second input/output buffer to the core via a third connection; and
   controlling a mode of operation of the first input/output buffer based on a signal received from the core via the third connection.

* * * * *

UNITED STATES PATENT AND TRADEMARK OFFICE
CERTIFICATE OF CORRECTION

PATENT NO.    : 6,285,211 B1  
DATED         : September 4, 2001  
INVENTOR(S)   : Stephen P. Sample et al.

It is certified that error appears in the above-identified patent and that said Letters Patent is hereby corrected as shown below:

Column 13,
Line 43, replace "capable of capable of" with -- capable of --.
Line 43, replace "bi-rectionally" with -- bi-directionally --.

Signed and Sealed this

Eleventh Day of February, 2003

JAMES E. ROGAN
*Director of the United States Patent and Trademark Office*